United States Patent [19]

Kinoshita

[11] Patent Number: 4,811,068
[45] Date of Patent: Mar. 7, 1989

[54] CHARGE TRANSFER DEVICE
[75] Inventor: Takao Kinoshita, Tokyo, Japan
[73] Assignee: Canon Kabushiki Kaisha, Tokyo, Japan
[21] Appl. No.: 220,889
[22] Filed: Jun. 16, 1988

Related U.S. Application Data

[63] Continuation of Ser. No. 633,292, Jul. 23, 1984, abandoned.

[30] Foreign Application Priority Data

Jul. 27, 1983 [JP] Japan .................. 58-137130

[51] Int. Cl.[4] ............................................. H01L 29/78
[52] U.S. Cl. .............................................. 357/24; 377/61
[58] Field of Search ......................... 357/24; 377/61, 62

[56] References Cited

U.S. PATENT DOCUMENTS

| | | | |
|---|---|---|---|
| 3,934,261 | 1/1976 | Sequin | 357/24 |
| 3,971,003 | 7/1976 | Kosonocky | 357/24 LR X |
| 4,251,834 | 2/1981 | Hall | 357/24 LR X |
| 4,270,144 | 5/1981 | Hartman et al. | 357/24 X |
| 4,320,363 | 3/1982 | Kaschte | 357/24 X |
| 4,381,516 | 4/1983 | Kadota | 357/24 |
| 4,403,237 | 9/1983 | Ohkubo et al. | 357/24 |
| 4,513,313 | 4/1985 | Kinoshita et al. | 357/24 LR X |
| 4,623,620 | 4/1987 | Felix | |
| 4,641,183 | 2/1987 | Kinoshita | |

Primary Examiner—Andrew J. James
Assistant Examiner—Sara W. Crane
Attorney, Agent, or Firm—Fitzpatrick, Cella, Harper & Scinto

[57] ABSTRACT

A charge transfer device comprising, photoelectric converting elements arranged along rows and columns, first charge transfer paths to horizontally transfer the charges obtained by those elements, a second charge transfer path to vertically transfer the charges transferred through the first charge transfer paths, and third charge transfer paths to couple the respective charge output parts of the first charge transfer paths and the charge input parts of the second charge transfer path corresponding to the output parts. Each third charge transfer path is connected to the first and second charge transfer paths so as to form almost an obtuse angle to those first and second paths, respectively. In this device, the length in the charge transferring direction of each charge transfer cell can be shortened while keeping the capacity of each cell constant, thereby improving the charge transfer efficiency at the junctions of the first and second charge transfer paths even when the charges are transferred at a high speed.

9 Claims, 11 Drawing Sheets

CHARGE TRANSFER DEVICE

This application is a continuation of application Ser. No. 633,292 filed July 23, 1984, now abandoned.

BACKGROUND OF THE INVENTION

1. Field of the Invention

The present invention relates to a charge transfer device and, more particularly, to a charge transfer device comprising one or a plurality of first charge transfer path(s) to transfer the charges in a first predetermined direction and a second charge transfer path to transfer the charge transferred through the first charge transfer path(s) in a direction which is substantially perpendicular to the first transferring direction of the charges by way of the first charge transfer path(s).

2. Description of the Prior Art

The charge transfer device as mentioned above can be implemented, for example, in a combination of the vertical transfer register and horizontal transfer register in an interline type CCD solid-state image sensing device, or in a combination of a storage part consisting of a vertical transfer register and a horizontal transfer register for reading out in a frame transfer type CCD solid-state image sensing device, or in a combination of the horizontal transfer register and vertical transfer register in a line address type CCD solid-state image sensing device.

On the other hand, in such conventional solid-state image sensing devices, the connecting portion of the horizontal (or vertical) transfer register and the vertical (or horizontal) transfer register has a construction as shown, for example, in FIG. 1. Namely, in the diagram, RH denotes a horizontal (or vertical) transfer register and RV indicates a vertical (or horizontal) transfer register. As shown in the diagram, the transfer register RH crosses the transfer register RV at substantially right angles, and the length of one transfer cell $RV_b$ in the transfer register RV at the junction with the transfer register RH is equal to the width of the transfer register RH. In addition, arrows H and V in the diagram represent the transferring directions of the charges in registers RH and RV, respectively, and $RH_a$ and $RV_a$ each indicate one transfer cell, In order to prevent deterioration in transfer efficiency even when the charges are transferred at a high speed, assuming that the capacity of each transfer cell of the transfer registers is constant, it is known that the length in the transferring direction of the charges should preferably be as short as possible. On the other hand, in the construction shown in FIG. 1, the length of the transfer cell $RV_b$ of the transfer register RV at the junction is long in the charge transfer directions of both the transfer registers RH and RV. Therefore, particularly upon transfer of the charges at a high speed, the transfer efficiency of the charges at this junction ($RV_a$) becomes worse, so that good high-speed transfer of charges can be hardly expected.

SUMMARY OF THE INVENTION

The present invention is made in consideration of the circumstances as mentioned above and is intended to provide a novel charge transfer device comprising one or a plurality of first charge transfer path(s) to transfer the charges in a first predetermined direction and a second charge transfer path to transfer the charges which are transferred through the first charge transfer path(s) in a second direction which is substantially perpendicular to the first transferring direction of the charges by way of the first charge transfer path(s), whereby in order to improve the transfer efficiency of the charges at the junctions of these first and second charge transfer paths, particularly, upon high-speed transfer of charges, the length in the transferring direction of the charges can be made relatively small with the capacity of each transfer cell is constant.

Another object of the invention is to provide a solid-state image sensing device which can transfer the charges at a high speed and, accordingly, can read out the charges at a high speed.

Other objects and features of the present invention will be apparent from the following detailed description in conjunction with the accompanying drawings

DETAILED DESCRIPTION OF THE PREFERRED EMBODIMENTS

Embodiments of the present invention will now be described hereinbelow with reference to the accompanying drawings.

Figure 1:
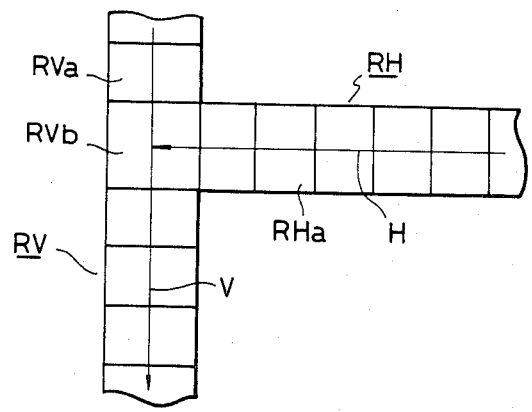
FIG. 1 is a diagrammatical view showing a constitution of the conventional charge transfer device, particularly, showing the construction of the main part with regard to the present invention.

FIG. 2 shows the constructions of four embodiments of the present invention, particularly, those of the main parts with regard to the invention, in which the same parts and elements as those shown in FIG. 1 are designated by the same reference numerals.

Figure 2A:
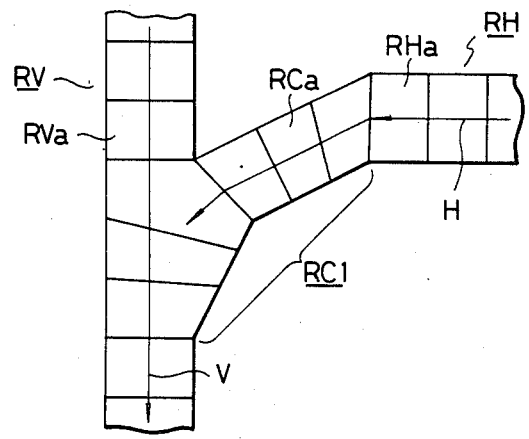
FIGS. 2A, 2B, 2C and 2D are diagrammatical views showing constructions of four embodiments of a charge transfer device according to the present invention, in particular, showing the construction of the main parts with respect to the invention.

First, the first embodiment shown in FIG. 2A is constituted in the manner such that a charge output part of the horizontal (or vertical) transfer register RH serving as the first charge transfer path to transfer the charges in the direction indicated by the arrow H in the diagram and a charge input part of the vertical (or horizontal)

register RV serving as the second charge transfer path to transfer the charges in the direction indicated by the arrow V (in the diagram) which is perpendicular to the direction H corresponding to the above-mentioned charge output part are coupled by a coupling register RC1 serving as the third charge transfer path or buffer part for coupling and which is formed like a polygon. $RC_a$ indicates one transfer cell of the coupling register RC1.

Figure 2B:
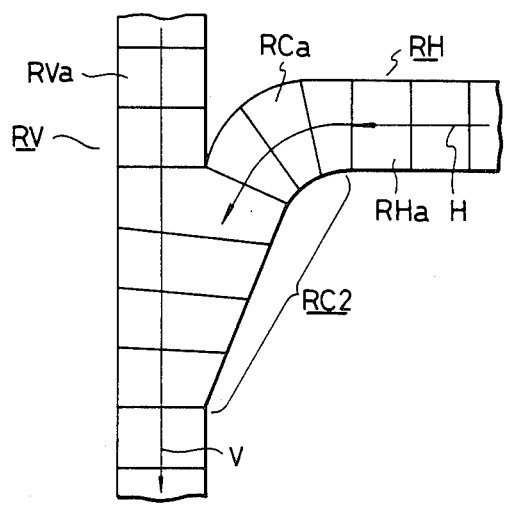

Next, the second embodiment shown in FIG. 2B is constituted in the manner such that the above-mentioned output part of the horizontal (or vertical) transfer register RH and the input part of the vertical (or horizontal) transfer register RV corresponding to the output part are coupled by a coupling register RC2 which is formed by coupling an oblique portion and an arc-like portion.

Figure 2C:
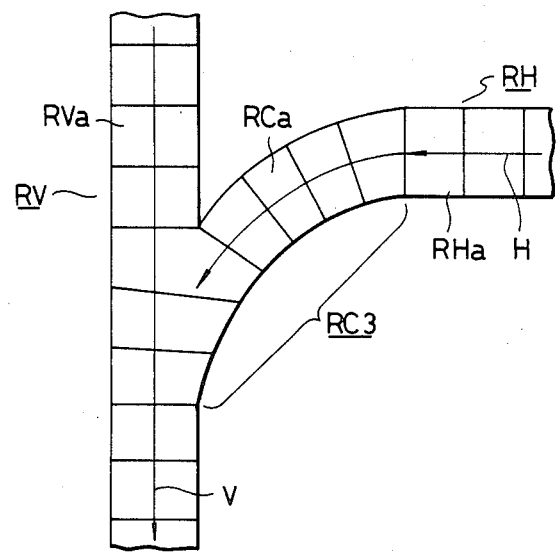

Then, the third embodiment shown in FIG. 2C is constituted in the manner such that the foregoing output part of the horizontal (or vertical) transfer register RH and the input part of the vertical (or horizontal) transfer register RV corresponding thereto are coupled by an arc-like coupling register RC3.

Figure 2D:
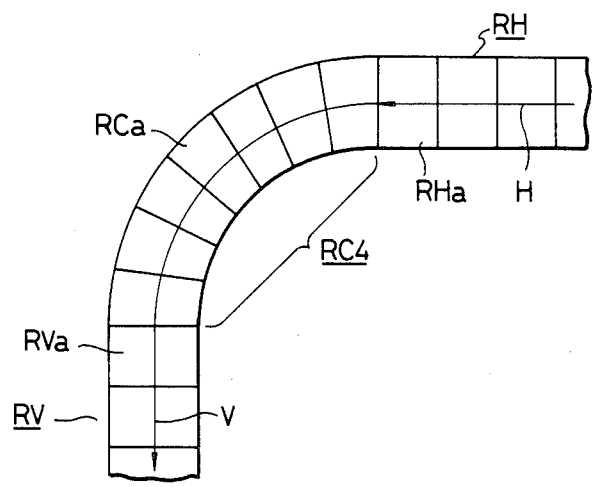

All of the three embodiments shown in FIGS. 2A to 2C illustrate examples in the case where the edge portion of the horizontal (or vertical) transfer register RH and the intermediate portion of the vertical (or horizontal) transfer register RV are coupled. On the other hand, the fourth embodiment, shown in FIG. 2D, is constituted in the manner such that the edge portions of both registers RH and RV are coupled by an arc-like coupling register RC4 similarly to the third embodiment of FIG. 2C.

In the four embodiments illustrated, the coupling registers RC1, RC2, RC3 and RC4 are all coupled to the output parts and input parts of the transfer registers RH and RV so as to form substantially obtuse angles to the two transfer registers RH and RV, respectively. Due to this, it is possible to shorten the length of each transfer cell in the charge transferring direction while keeping constant the capacity of each transfer cell of the output parts and input parts of both registers RH and RV and of the coupling registers RC1, RC2, RC3 and RC4. Therefore, this enables the charges to be efficiently and preferably transferred without making the transfer efficiency deteriorate even during transfer of the charges.

In addition, as will be understood from the diagram, the transferring direction of the charges may be opposite to the direction indicated by the arrows in the diagram and in such a case, a similar effect will be also obtained.

Next, with reference to FIGS. 3 to 6, there will be described as an example the case where the third embodiment of the present invention shown in FIG. 2C, for instance, is applied to the CCD solid-state image sensing device of the line address type.

Figure 3:
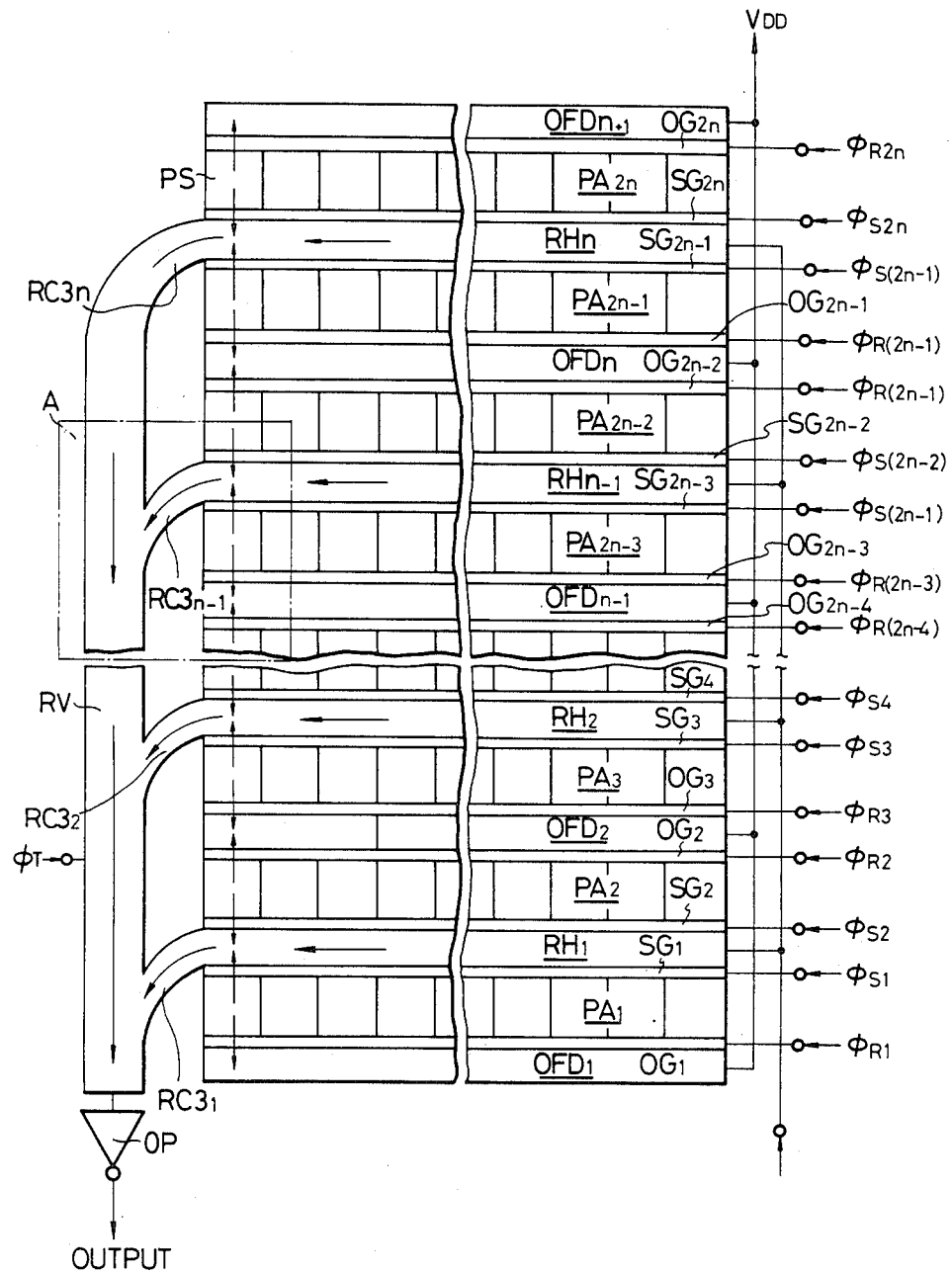
FIG. 3 is a diagrammatical view showing a construction of the device in one example in the case where the third embodiment shown in FIG. 2C is applied to a CCD solid-state image sensing device of the line address type.

First, in FIG. 3, PS denotes photo-charge converting cells which are arranged like a matrix along the columns and rows shown in the diagram. The arrays of the respective rows at this time are indicated at $PA_1$ to $PA_n$, respectively. $RH_1$ to $RH_n$ denote horizontal transfer registers to horizontally transfer the charges of the respective row arrays of the photo-charge converting cells PS. As shown in the diagram, each of the horizontal transfer registers $RH_1$ to $RH_n$ is provided for two row arrays of the photo-charge converting cells PS; namely, each one of them is arranged so as to be commonly used for the adjacent two row arrays of the photo-charge converting cells PS. $OFD_1$ to $OFD_{n+1}$ represent overflow drains and each one of them is provided for two row arrays of the photo-charge converting cells PS in a similar manner, so as to alternate with the horizontal transfer registers RH. Namely, each overflow drain is arranged so as to be commonly used for two adjacent row arrays of the photo-charge converting cells PS. $SG_1$ to $SG_{2n}$ are shift gates arranged between the row array and the horizontal transfer register $RH_i$ of each photo-charge converting cell PS. $OG_1$ to $OG_{2n}$ are overflow drain gates arranged between the row array and the overflow drain $OFD_i$ of each photo-charge converting cell PS. RV is the vertical transfer register to vertically transfer the charges which are horizontally transferred through the horizontal transfer register $RH_i$. The charge output part of each of the horizontal transfer registers $RH_1$ to $RH_n$ and the charge input part of the vertical transfer register RV corresponding thereto are coupled by the arc-like coupling registers $RC3_1$ to $RC3_n$ as described in conjunction with FIG. 2C. OP denotes an output amplifier to convert the charges transferred vertically through the vertical transfer register RV to a voltage and to output it.

Figure 4:
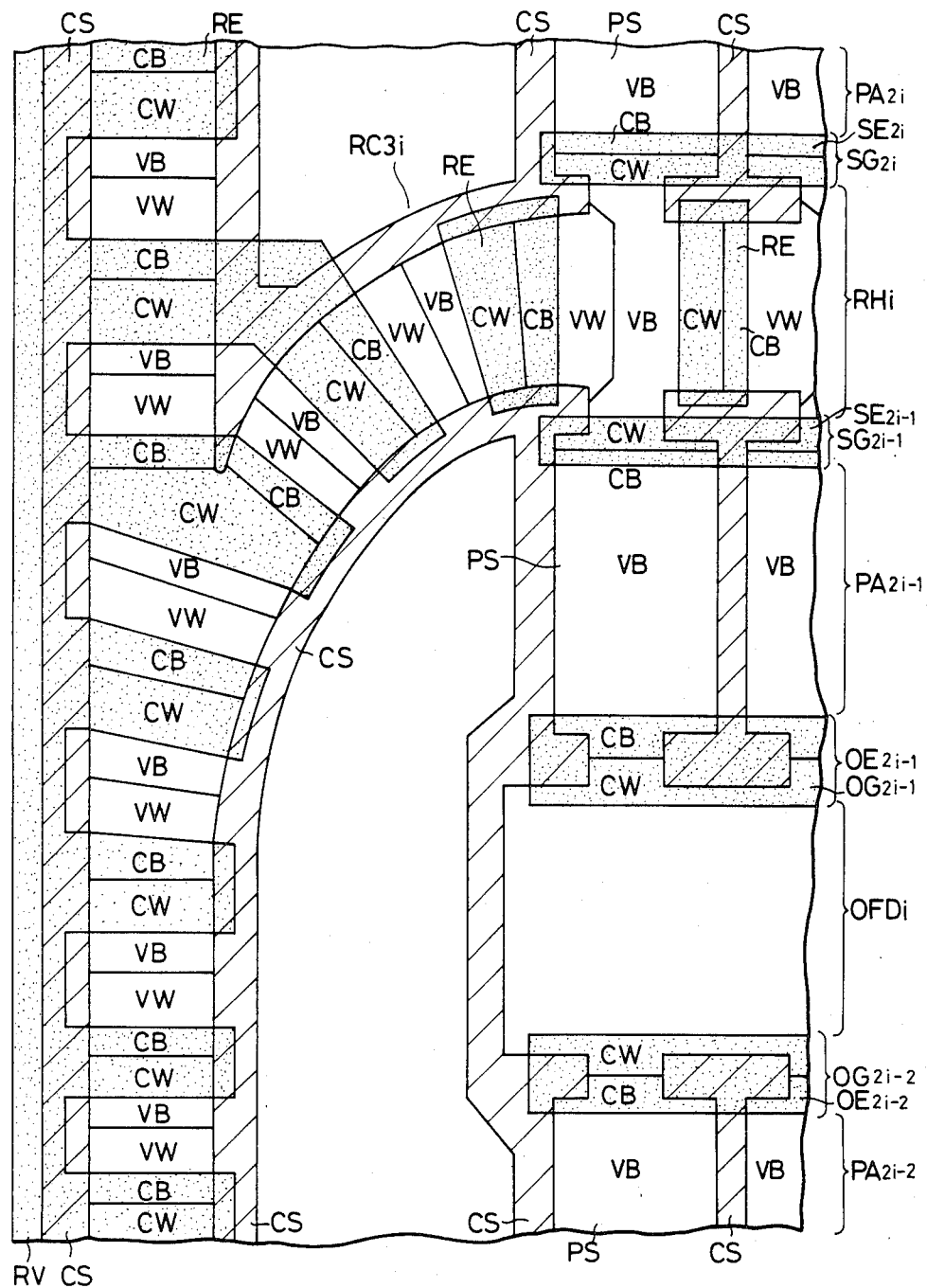
FIG. 4 illustrates a detailed enlarged diagram of the portion indicated at A in FIG. 3 in accordance with the single-phase driving method.

FIG. 4 illustrates an enlarged diagram of the portion indicated at A in FIG. 3 with respect to the above-mentioned image sensing device in the case where, particularly, the single-phase driving method is employed as the driving method.

Figure 5:
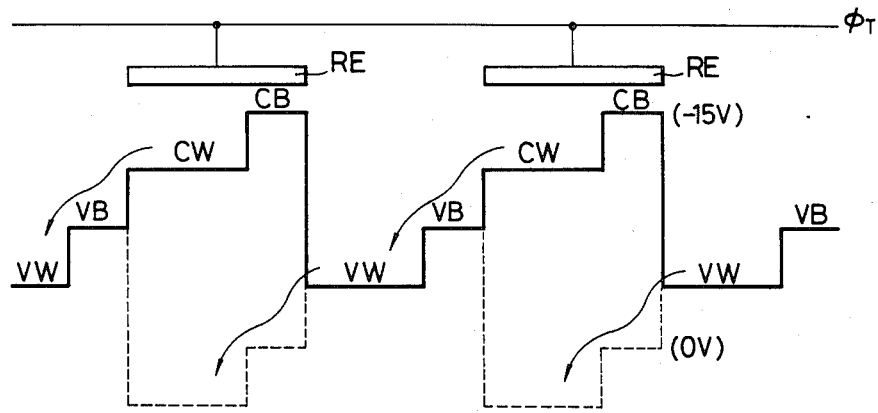
FIG. 5 is a diagrammatical view used to explain the potential structure of one charge transfer cell in FIG. 4.

In the diagram, VB denotes virtual barriers; VW indicates virtual wells; CB represents clocked barriers; and CW denotes clocked wells. For example, the potential heights P(VB), P(VW), P(CB), and P(CW) thereof with respect to the electrons have the following mutual relations due to means such as ion implantation or the like to a silicon substrate. Namely, as shown in FIG. 5, the relations of P(VB) > P(VW) and P(CB) > P(CW) are always satisfied. Also, with regard to the clocked barriers CB and clocked wells CW, they are formed in the manner such that the relation in potentials of P(CB) > P(CW) > P(VB) > P(VW) is satisfied in the case where, for instance, the voltage of −15 V was applied and such that the relation of P(VB) > P(VW) > P(CB) > P(CW) is satisfied in the case where the voltage of zero volt was applied, in dependence upon the voltage which is applied to the common polysilicon electrode formed on those CB and CW.

On the other hand, each one transfer cell in the horizontal, vertical and coupling registers $RH_i$, RV and $RC3_i$ is constituted by one combination of CB−CW−VB−VW. Also, the shift gates $SG_{2i}$ and $SG_{2i-1}$ and overflow drain gates $OG_{2i-1}$ and $OG_{2i-2}$ are constituted by CB and CW. Further, the photo-charge converting cell PS is constituted by VB. In addition, all of the portions excluding the photo-charge converting cells PS are shielded against the light by a light shielding layer.

CS denotes channel stops. RE indicates electrodes for the individual transfer cells of the respective registers RH, RV and RC3 and a single-phase transfer pulse $\phi_T$ is commonly applied to those electrodes. $SE_i$ is an electrode of the shift gate $SG_i$ and a shift pulse $\phi_{Si}$ is applied thereto. $OE_i$ is an electrode of the overflow drain gate $OG_i$ and a reset pulse $\phi_{Ri}$ is applied thereto.

With such an arrangement, in the state whereby the transfer pulse $\phi_T$ is applied to the transfer registers RH, RC3 and RV through the electrodes RE thereof, when the shift pulse $\phi_{S1}$ is now applied to the shift gate $SG_1$ through the electrode $SE_1$ thereof at a proper timing synchronized with the transfer pulse $\phi_T$, the charges of the row array $PA_1$ of the first photo-charge converting cell PS are taken in the horizontal transfer register $RH_1$ through the shift gate $SG_1$. After these charges have been input into the vertical transfer register RV through the horizontal transfer register $RH_1$ and coupling register $RC3_1$, they are vertically transferred through the vertical transfer registers RV and are finally converted to the voltage by the output amplifier OP and are output. Next, by applying the shift pulse $\phi_{S3}$ to the shift gate $SG_3$ through the electrode $SE_3$ thereof, the charges of the row array $PA_3$ of the third photo-charge converting cell PS are taken in the horizontal transfer register $RH_2$ through the shift gate $SG_3$. After these charges have been input into the vertical transfer register RV through the horizotal transfer register $RH_2$ and coupling register $RC3_2$, they are similarly vertically transferred and are converted to a voltage by the output amplifier OP and are output. In a similar manner to that described above, by sequentially driving the odd-number designated shift gates $SG_5$, $SG_7$, ..., $SG_{2n-1}$, it is possible to sequentially read out the charges of the odd-number designated row arrays $PA_5$, $PA_7$, ..., $PA_{2n-1}$ of the photo-charge converting cells PS. In this way, the signals of the odd-number fields of a television can be obtained.

After the odd-number designated row arrays $PA_1$, $PA_3$, ..., $PA_{2n-1}$ have been completely read out, by subsequently reading out the charges of the even-number designated row arrays $PA_2$, $PA_4$, ..., $PA_{2n}$ using a similar operation, the signals of the even-number fields can be obtained.

The lengths of transfer paths in the regions from the start ends (leftmost portions) of the respective row arrays $PA_1$ to $AP_{2n}$ of the photo-charge converting cells PS to the last end of the vertical transfer register RV are respectively different for each of the row arrays $PA_1$—$PA_{2n}$. Therefore, when the charges are read out, it is necessary to put the start timings for reading out the charges of the respective row arrays $PA_1$ to $PA_{2n}$ forward little by little. By operating in this way, each line signal can be time-continuously derived at a predetermined horizontal blanking interval.

In the case of obtaining the signals by the image sensing device shown here at the rate (60 fields/second) in accordance with the NTSC system, the photo-receiving time of each photo-charge converting cell PS, namely, the charge storage time becomes 1/30 second, so that the sensitivity is improved. On the other hand, in the case where this image sensing device is used for the frame image pickup in the still video, the photo-charge converting cells PS are light-shielded by use of a shutter or the like in association with the elapse of the necessary storage time period, and two fields may be read out in this light-shielded state in the manner as mentioned above.

On the other hand, in the case where the overflow of charges occurs in any photo-charge converting cell PS during the accumulation of charges, the charges overflowed flow into the overflow drain $OFD_i$ through the overflow drain gate $OG_i$ associated with that row array $PA_i$ and are cleared. Further, the appropriate control of this overflow drain gate $OG_i$ enables the adjustment of the above-mentioned charge storage time. Namely, practically speaking, when the reset pulse $\phi_{Ri}$ is applied through the electrode $OE_i$ to the overflow drain gate $OG_i$ associated with each row array $PA_i$ at the timing which is time-precedent by a predetermined time period from the timing for readout of the charges of the row array $PA_i$, the charges of the row array $PA_i$ which have been accumulated so far flow into the overflow drain $OFD_i$ through the gate $OG_i$ and are cleared. Thereafter, the charges accumulated in the time period until the shift pulse $\phi_i$ is applied to the shift gate $SG_i$ are fetched as the signal charges. Therefore, by suitably controlling the time interval until the shift pulse $\phi_{Si}$ is applied after the reset pulse $\phi_{Ri}$ was applied, the storage time can be adjusted.

Figure 6:
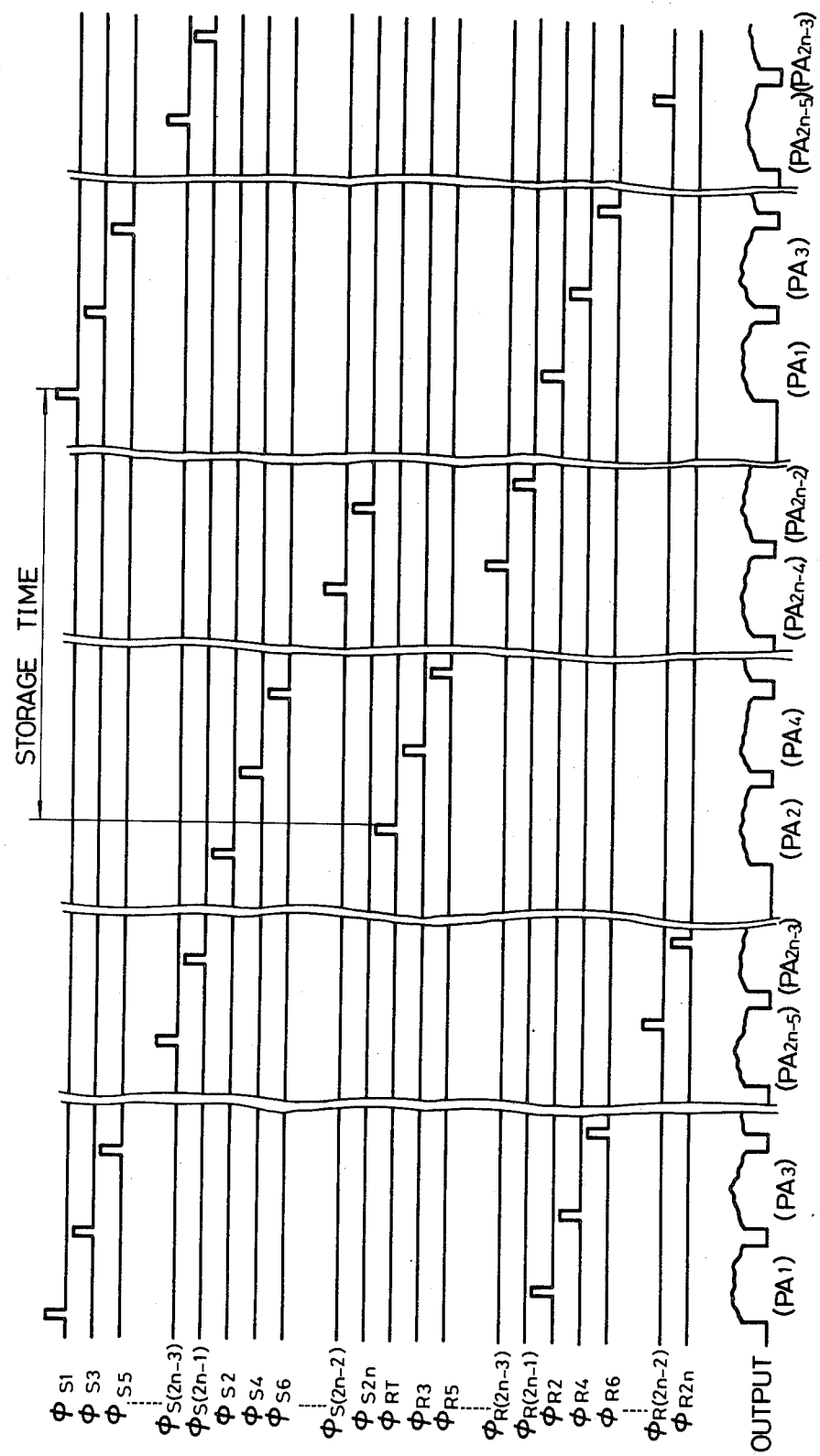
FIG. 6 is a timing chart illustrating the operation of the image sensing device shown in FIG. 3 when driven.

Examples of the above-described respective timing pulses $\phi_{Si}$ and $\phi_{Ri}$ and an output signal which is obtained due to these pulses are schematically shown in FIG. 6.

In the solid-state image sensing device described in conjunction with FIGS. 3 to 6, the coupling register $RC3_i$ is provided between the horizontal transfer register $RH_i$ and vertical transfer register RV, thereby enabling the charges to be transferred at a high speed while maintaining good transfer efficiency. That is to say, generally, in the image sensing device of the line address type, the signal of each line has to be scanned at the horizontal scanning rate (15.75 kHz in the NTSC system) of the television. For example, assuming that the number of pixels in the horizontal direction is about 780, one line has to be scanned at a very high speed of about 14 MHz in the case of the NTSC system. However, even in this case, in the arrangement of the image sensing device mentioned above, it is possible to shorten the length of the charge transfer channel in the charge transferring direction of each transfer cell; therefore, even when the charges are transferred at a high speed in this way, good transfer efficiency can be maintained. In addition, as mentioned above, by arranging two shift gates SG and horizontal transfer register RH or overflow drain OFD between the row arrays of the respective photo-charge converting cells PS and by properly selecting the widths thereof in the vertical direction, the pitch of the photo-charge converting cells PS in the vertical direction can be made constant in spite of the fact that the upper and lower structures with respect to the row arrays of the respective adjacent photo-charge converting cells PS mutually differ. Due to this, the foldover distortion in the vertical direction can be reduced. In addition by arranging the overflow drain OFD between the horizontal transfer registers RH, the coupling register RC3 can be smoothly arranged.

Figure 7:
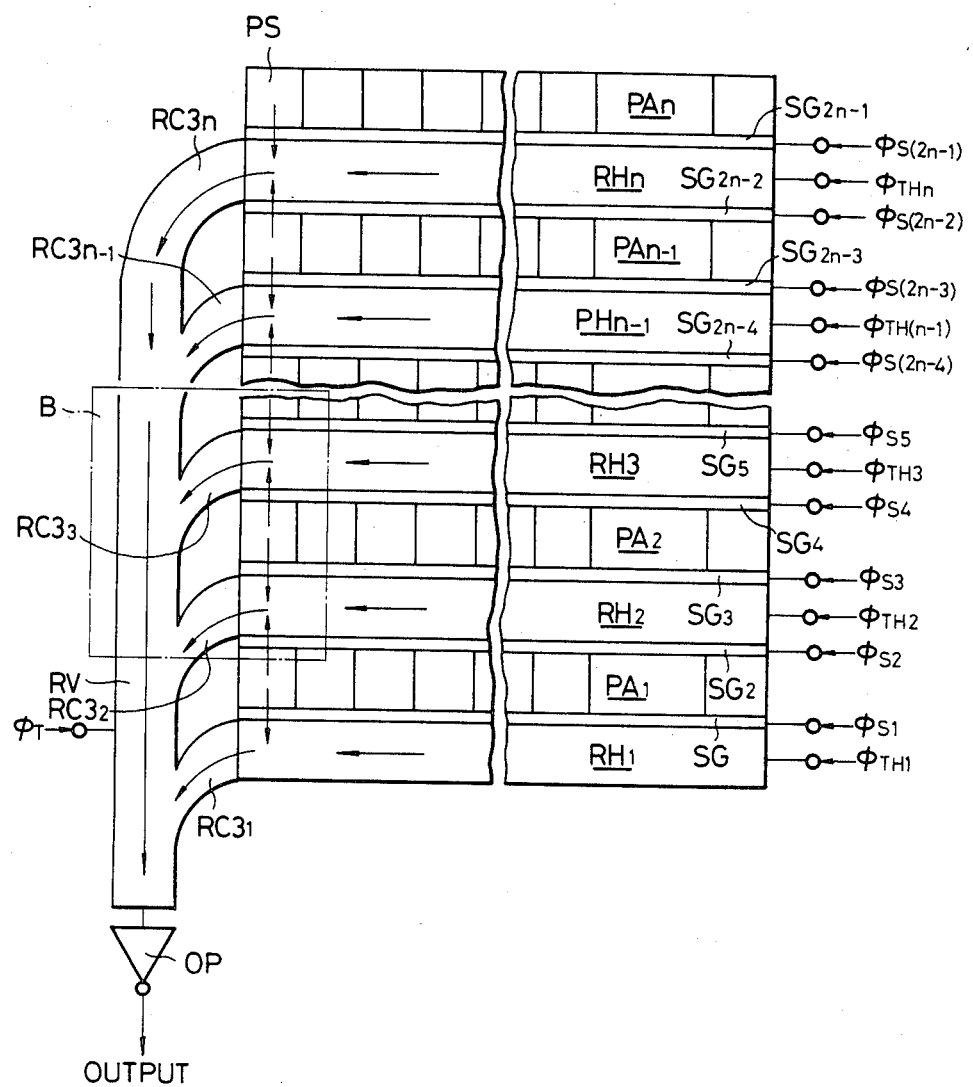
FIG. 7 is a diagrammatical view showing the construction of the device in another example in the case where the third embodiment shown in FIG. 2C is applied to a CCD solid-state image sensing device of the line address type.
Figure 8:
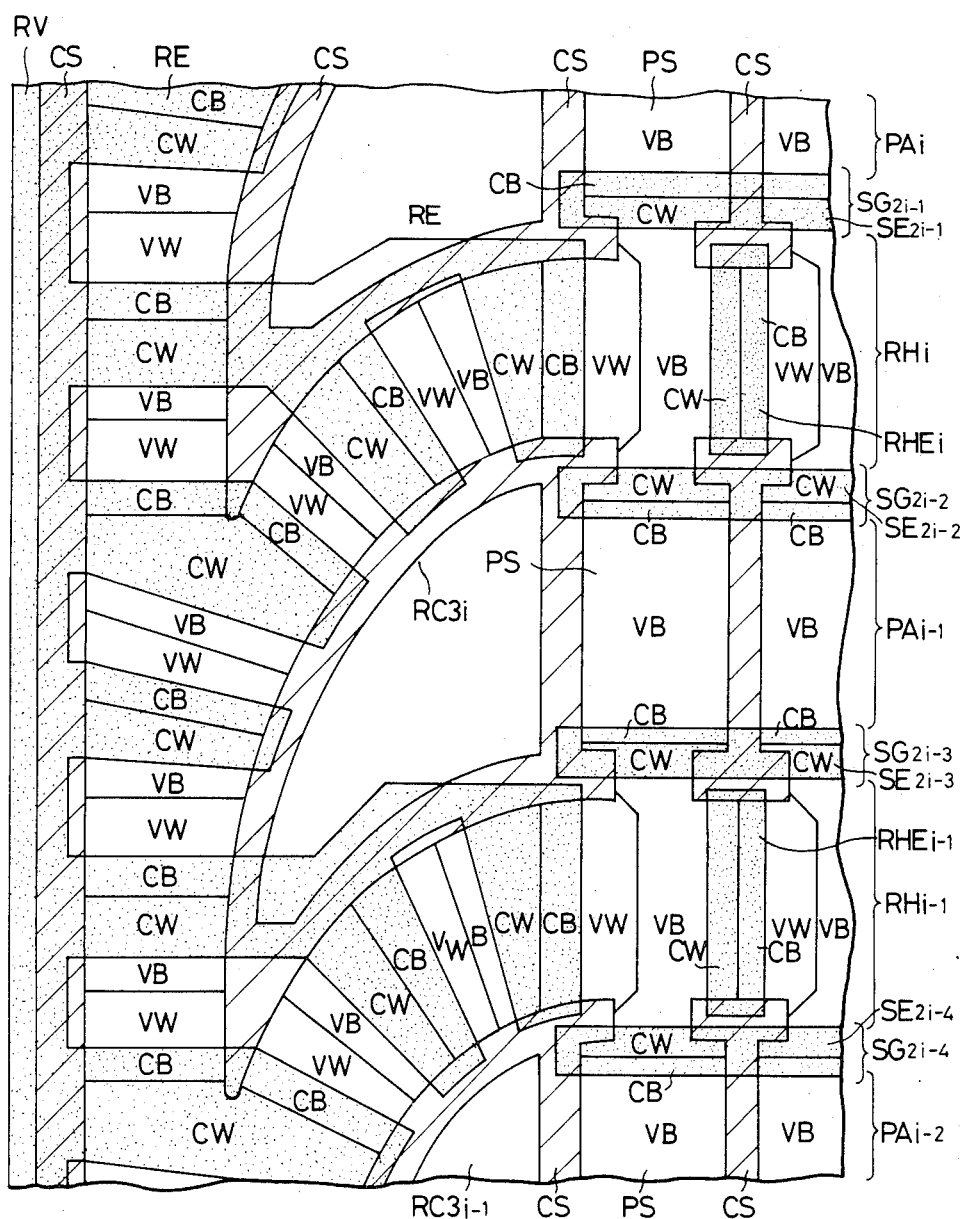
FIG. 8 is a detailed enlarged diagram of the portion indicated at B in FIG. 7 in accordance with the single-phase driving method.
Figure 9A:
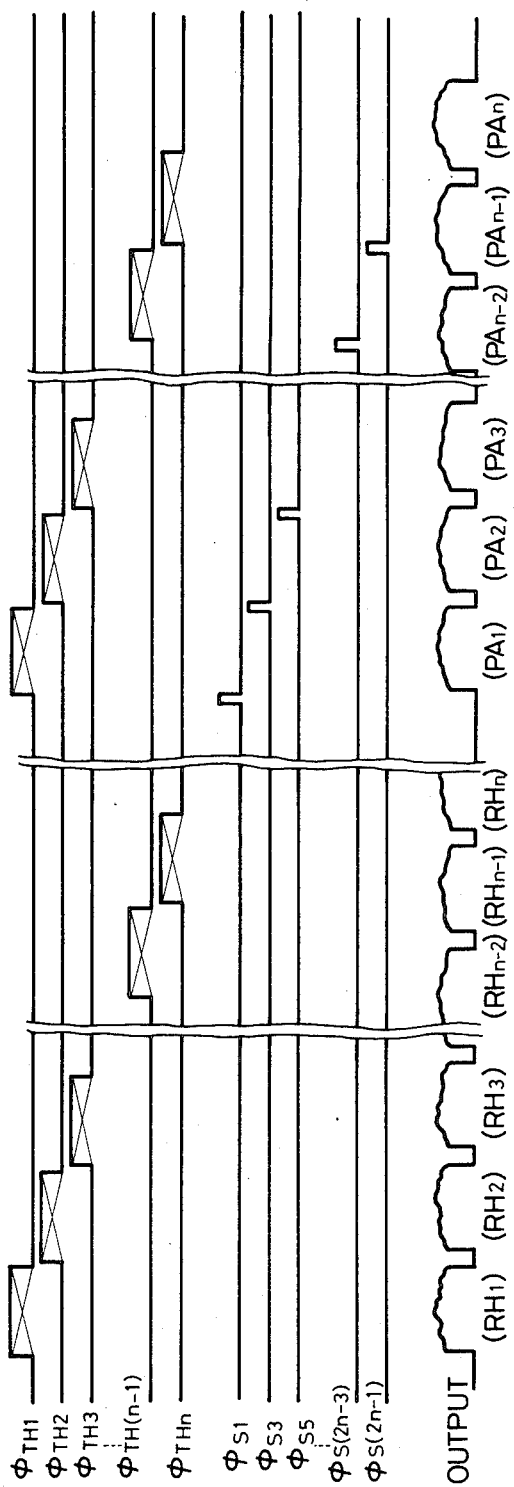
FIGS. 9A and 9B are timing charts showing operation at the time of frame image pickup in a still video and at the time of interlace image pickup in a movie video of the image sensing device shown in FIG. 7.

Another example of the DDC solid-state image sensing device of the line address type to which the third embodiment of the present invention shown in FIG. 2C is employed will be described with reference to FIGS. 7 to 9. In FIGS. 7 to 9, the same parts and components as those shown in FIGS. 3 to 6 are designated by the same reference numerals.

In this image sensing device shown here, as shown in FIG. 7, the row arrays $PA_1$ to $PA_n$ and horizontal transfer registers $RH_1$ to $RH_n$ of the photocharge converting cells PS are alternately arranged through the shift gates $SG_1$ to $SG_{2n-1}$.

As illustrated in FIG. 8, in the case where the single-phase driving method is adopted as the driving method, similarly to the case of the foregoing example, each one transfer cell of the respective registers $RH_i$, $RC3_i$ and RV is composed of a set of CB—CW—VB—VW, while the shift gate $SG_i$ is constituted by CB and CW.

In this example unlike the foregoing example, the shift gate $SG_i$ coupling register $RC3_i$ vertical transfer register RV, and output amplifier OP are shielded against the light, but the horizontal transfer register $RH_i$ is not light-shielded similarly to the photo-charge converting cells PS and also has the function of the photo-charge converting cell. In addition, for this purpose, the electrodes RE of the respective transfer cells of the register $RC3_i$ and RV are commonly connected, but an electrode $RHE_i$ of each transfer cell of the horizontal transfer register $RH_i$ is commonly connected for every horizontal transfer register $RH_i$ and a horizontal transfer pulse $\phi_{THi}$ is applied thereto, respectively.

The image sensing device of FIG. 7 is constituted substantially similar to the case of the foregoing example except as to the above-mentioned points.

For instance, to perform the frame image pickup in the still video in the above-explained arrangement, the horizontal transfer pulse $\phi_{TH1}$ is applied to the electrode $RHE_1$ of the first horizontal transfer register $RH_1$ in the state whereby the photo-charge converting cells PS and horizontal transfer register $RH_i$ are light-shielded by use of means such as a shutter or the like with the elapse of a predetermined storage time and whereby the transfer pulse $\phi_T$ is applied to the coupling register $RC3_i$ and vertical transfer register RV through the common electrode RE thereof. Thus, charges which had been generated due to light excitation and which have been accumulated so far in the regions of VW of the respective transfer cells of the horizontal transfer register $RH_1$ are horizontally transferred through the horizontal transfer register $RH_1$ and are input through the coupling register $RC3_1$ to the vertical transfer RV. Then the charges are vertically transferred through the vertical transfer register RV and are converted to a voltage by the output amplifier OP and are output. Subsequently, by similarly driving the second horizontal transfer register $RH_2$ by use of the horizontal transfer pulse $\phi_{TH2}$, the charges of the horizontal transfer register $RH_2$ are read out. In manner similar to that described as above, by sequentially driving the horizontal transfer registers $RH_3$, $RH_4$, ..., $RH_n$, the charges of the horizontal transfer registers $RH_3$ to $RH_n$ are respectively read out. In this way, the signals of the odd-number fields of the television are obtained.

After the charges of the horizontal transfer registers $RH_1$ to $RH_n$, namely, the signals of the odd-number fields have been completely read out as described above, when the shift pulse $\phi_{S1}$ is then applied to the shift gate $SG_1$ through the electrode $SE_1$ thereof, the charges of the row array $PA_1$ of the first photo-charge converting cell PS are taken in the horizontal transfer register $RH_1$ and then by driving this horizontal transfer register $RH_1$ in response to the horizontal transfer pulse $\phi_{TH1}$, the charges of the first row array $PA_1$ are read out in a similar manner to that mentioned above. Next, by applying the shift pulse $\phi_{S3}$ to the shift gate $SG_3$ through the electrode $SE_3$ thereof, the charges of the second row array $PA_2$ are taken in the second horizontal transfer register $RH_2$. Thereafter, by driving this horizontal transfer register $RH_2$ in response to the horizontal transfer pulse $\phi_{TH2}$, the charges of second row array $PA_2$ are read out. In a similar manner to that described above, the charges of the row arrays $PA_3$, $PA_4$, ..., $PA_n$ are sequentially taken in the horizontal transfer registers $RH_3$, $RH_4$, ..., $RH_n$ through the shift gates $SG_5$, $SG_7$, ..., $SG_{2n-1}$ and by driving these horizontal transfer registers $RH_3$, $RH_4$, ..., $RH_n$, the charges of the respective row arrays $PA_3$ to $PA_n$ are read out. Thus, the signal of the even-number fields are obtained.

Next, upon interlace image pickup in an ordinary movie video, by applying the horizontal transfer pulse $\phi_{TH1}$ to the first horizontal transfer register $RH_1$, the charges stored therein are first read out, thereby obtaining the signal of the first line of the odd-number field. Subsequently, by applying the shift pulse $\phi_{S2}$ to the shift gate $SG_2$, the charges of the first row array $PA_1$ are taken in the second horizontal transfer register $RH_2$ and the storage charges thereof are added in the horizontal transfer register $RH_2$. Also, by driving the horizontal transfer register $RH_2$ in response to the horizontal transfer pulse $\phi_{TH2}$, the signal of the second line of the odd-number field is obtained. Next, by applying the shift pulse $\phi_{S4}$ to the shift gate $SG_4$, the charges of the second row array $PA_2$ are taken in the third horizontal transfer register $RH_3$ and the storage charges are similarly added. By driving the horizontal transfer register $RH_3$, the signal of the third line is derived. In a similar manner to that described above, the charges of the row arrays $PA_3$, $PA_4$, ..., $PA_{n-1}$ are sequentially taken in the horizontal transfer registers $RH_4$, $RH_5$, ..., $RH_n$ through the shift gates $SG_6$, $SG_8$, ..., $SG_{2n-2}$ and the storage charges are added. Then, by sequentially driving these horizontal transfer registers $RH_4$ to $RH_n$, the signals of the odd-number fields can be obtained.

In this way, after the signals of the odd-number fields were obtained due to the addition of the charges of the row array $PA_i$ and horizontal transfer register $RH_{i-1}$ and due to the readout those charges, by applying the shift pulse $\phi_{S1}$ to the shift gate $SG_1$ through the electrode $SE_1$ thereof, the charges of the first row array $PA_1$ are taken in the first horizontal transfer register $RH_1$ and the two charges are added. At the same time, by driving the horizontal transfer register $RH_1$ in response to the horizontal transfer pulse $\phi_{TH1}$, the storage charges are read out, thereby obtaining the signal of the first line of the even-number field. In a the similar manner to that described above, the charges of the row arrays $PA_2$, $PA_3$, ..., $PA_n$ are sequentially taken in the horizontal transfer registers $RH_2$, $RH_3$, ..., $RH_n$ through the shift gates $SG_3$, $SG_5$, ..., $SG_{2n-1}$ and then by sequentially driving the respective horizontal transfer registers $RH_2$ to $RH_n$, the signals of the even-number fields can be derived.

Figure 9B:
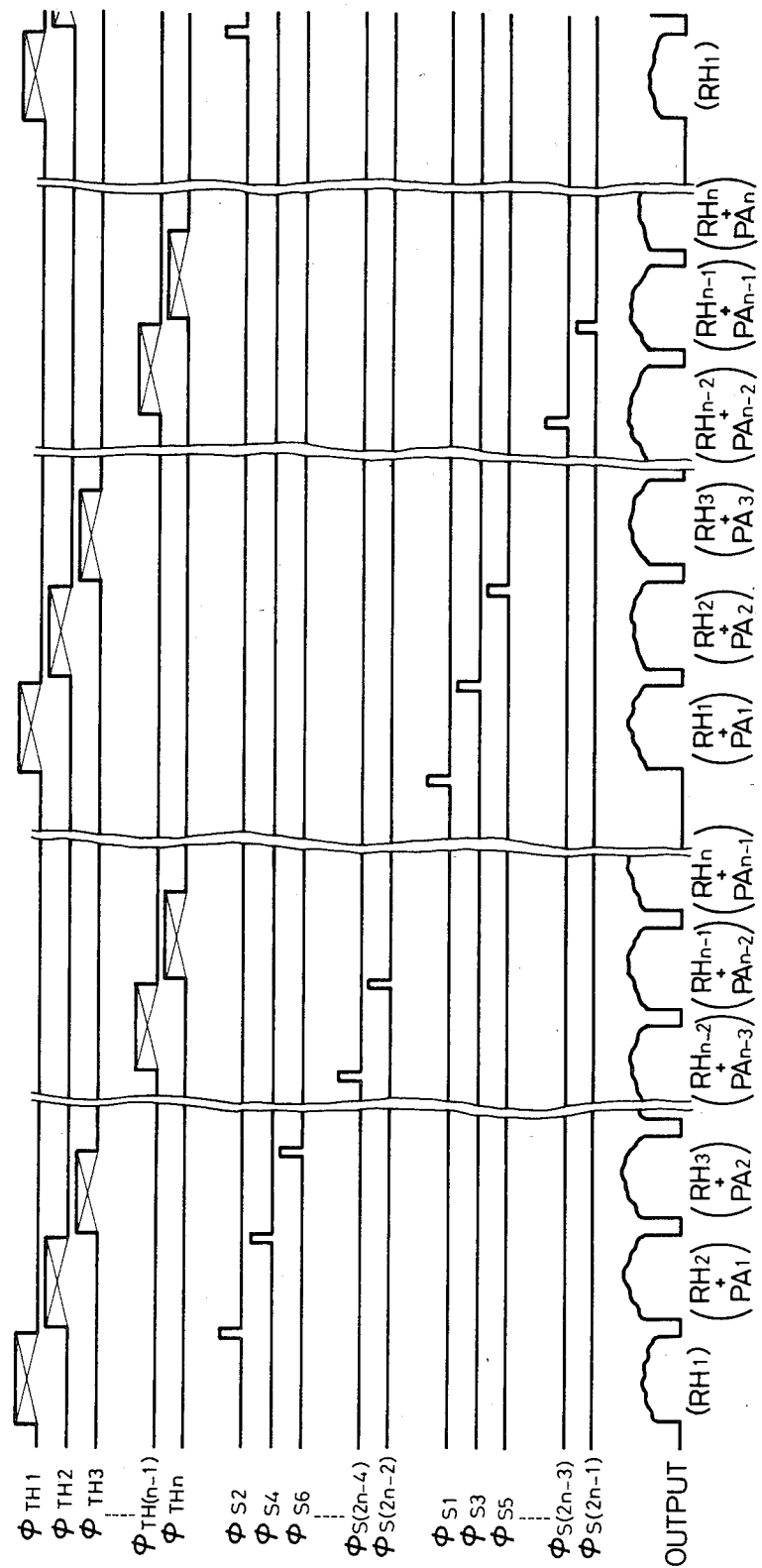

Examples of the respective timing pulses $\phi_{Si}$ and $\phi_{THi}$ and an output signal which is obtained due to these pulses upon the frame image pickup in the still video mentioned above are schematically shown in FIG. 9A. In addition, examples of the respective timing pulses $\phi_{Si}$ and $\phi_{THi}$ and an output signal which is obtained due to these pulses upon the interlace image pickup in the movie video are schematically shown in FIG. 9B.

In the example of the image sensing device described in conjunction with FIGS. 7 to 9, a similar effect to that in the case of the example of the image sensing device explained with respect to FIGS. 3 to 6 is also obtained.

As for anti-blooming means in the example of the image sensing device described in conjunction with FIGS. 7 to 9, for instance, it is possible to apply means by use of charge recombination such as disclosed in the official gazette of Japanese Laid-Open Patent Application No. 18064/1980. In this case, poly-silicon electrodes may be arranged to match the spectral sensitivity characteristics and the centers of gravity of the pixels of the converting cells in the row arrays PA and horizontal transfer registers RH and further these poly-silicon electrodes may be used as the electrodes for charge recombination.

The examples in the case where the third embodiment shown in FIG. 2C is applied to the solid-state image sensing device have been shown in FIGS. 3 to 9. However, the first and second embodiments shown in FIGS. 2A and 2B can be also similarly applied. On the other hand, although the line address type solid-state image sensing device has been shown in FIGS. 3 to 9 as an example of application of the embodiment shown in FIGS. 2A and 2B can be also similarly applied. On the other hand, although the line address type case where the high-speed transfer of charges is needed even in the solid-state image sensing device of the interline type and in the solid-state image sensing device of the frame transfer type. In addition, the invention is not limited to such solid-state image sensing devices but can be also advantageously applied to any other charge transfer device which is used for signal processing or memory.

As described in detail above, according to the present invention, in the charge transfer device comprising one or a plurality of first charge transfer path(s) to transfer charges in a first predetermined direction and a second charge transfer path to transfer the charges which are transferred through the first charge transfer path(s) in a second direction which is substantially perpendicular to the first transferring direction of the charges by way of the first charge transfer path(s), its length of each transfer cell in the charge tranferring direction can be shortened while keeping the capacity of each transfer cell constant in order to improve the charge transfer efficiency at the junctions of these first and second charge transfer paths, in particular, upon high-speed transfer. Thus, the invention is extremely useful for use in such charge transfer devices.

What I claim is:

1. A charge transfer device comprising:
    a plurality of first charge transfer paths to transfer charges in a predetermined first direction;
    a second charge transfer path to transfer the charges in a second direction, which is substantially perpendicular to said first direction, said second charge transfer path having a plurality of charge transfer stages;
    a plurality of third charge transfer paths to couple each of said first charge transfer paths to a corresponding one of said charge transfer stages, wherein each of said third charge transfer paths gradually changes direction, from said first direction to said second direction, and has a plurality of charge transfer stages, an angle of border between each of said charge transfer stages and said first direction changing gradually in one direction; and
    driving means for selecting one of said plurality of first charge transfer paths every horizontal period of a television scan and reading out the charge of said selected one of said first transfer paths via said second charge transfer path during said horizontal period.

2. A charge transfer device according to claim 1, wherein said third charge transfer path has a component in a transferring direction which exists between the transferring direction of said first charge transfer path and the transferring direction of said second charge transfer path.

3. A charge transfer device according to claim 1, wherein said third charge transfer path has a substantially curve-like transfer path.

4. A charge transfer device comprising:
    a plurality of first charge transfer paths to respectively transfer charges in a predetermined first direction, each of said first charge transfer paths having a respective charge output part;
    a second charge transfer path to transfer the charges which are transferred through said first charge transfer paths in a second direction, which is substantially perpendicular to said first direction, said second charge transfer path having a plurality of charge input parts and a charge output part;
    a plurality of third charge transfer paths to couple said respective charge output parts of said plurality of first charge transfer paths and a plurality of charge input parts of said second charge transfer path, each of said third charge transfer paths corresponding to one of said output parts of said first charge transfer paths and having a plurality of charge transfer stages wherein an angle of border between each of said charge transfer stages and said first direction gradually changes in one direction, said third charge transfer paths being connected to said first and second charge transfer paths so as to gradually change the transfer direction in said third charge transfer paths, from said first direction to said second direction; and
    driving means for selecting one of said plurality of first charge transfer paths every horizontal period of a television scan and reading out the charge of said selected one of said first transfer path via said second charge transfer path during said horizontal period.

5. A charge transfer device according to claim 4, wherein said third charge transfer path has a transferring direction which exists between the transferring direction of said first charge transfer path and the transferring direction of said second charge transfer path.

6. A charge transfer device according to claim 4, wherein said third charge transfer path has a substantially curve-like transfer path.

7. A charge transfer device according to claim 4, wherein said plurality of first charge transfer paths transfer image pickup information.

8. A charge transfer device according to claim 7, wherein said first charge transfer paths have a photoelectric converting function.

9. A charge transfer device according to claim 7, wherein said first charge transfer paths are connected to pixels for performing photoelectric conversion.

* * * * *